(12) United States Patent
Tanaka et al.

(10) Patent No.: US 12,382,741 B2
(45) Date of Patent: Aug. 5, 2025

(54) SOLID-STATE IMAGING ELEMENT AND ELECTRONIC DEVICE

(71) Applicant: SONY SEMICONDUCTOR SOLUTIONS CORPORATION, Kanagawa (JP)

(72) Inventors: Takayuki Tanaka, Kanagawa (JP); Tomohiko Baba, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 439 days.

(21) Appl. No.: 17/758,451

(22) PCT Filed: Dec. 2, 2020

(86) PCT No.: PCT/JP2020/044823
§ 371 (c)(1),
(2) Date: Jul. 6, 2022

(87) PCT Pub. No.: WO2021/145082
PCT Pub. Date: Jul. 22, 2021

(65) Prior Publication Data
US 2023/0036259 A1  Feb. 2, 2023

(30) Foreign Application Priority Data
Jan. 14, 2020  (JP) .................... 2020-003397

(51) Int. Cl.
*H10F 39/00* (2025.01)
(52) U.S. Cl.
CPC ............... *H10F 39/8057* (2025.01)

(58) Field of Classification Search
CPC ......... H01L 27/14623; H01L 27/14621; H01L 27/14625; H01L 27/14643;
(Continued)

(56) References Cited

U.S. PATENT DOCUMENTS

2008/0179738 A1 *  7/2008  Nishimura .......... H01L 25/0655
257/737
2019/0259633 A1    8/2019  Masataka
2019/0385968 A1 * 12/2019  Fujimagari ....... H01L 27/14685

FOREIGN PATENT DOCUMENTS

JP   08-097535 A   4/1996
JP   H11097535 A   4/1999
(Continued)

OTHER PUBLICATIONS

International Search Report and Written Opinion of PCT Application No. PCT/JP2020/044823, issued on Jan. 12, 2021, 11 pages of ISRWO.

*Primary Examiner* — Thanh Luu
*Assistant Examiner* — Mai Thi Ngoc Tran
(74) *Attorney, Agent, or Firm* — CHIP LAW GROUP

(57) ABSTRACT

A dam region that blocks an outflow of a resin from a chip mounting region suppresses an influence of incident light. A solid-state imaging element is provided with a pixel region in which a plurality of pixels is arranged, and a chip mounting region in which a chip is mounted. Furthermore, a dam region that blocks an outflow of a resin from the chip mounting region is arranged around the chip mounting region. Furthermore, the dam region has a saw-tooth shape toward an outer side at least partially. Furthermore, incident light is repeatedly reflected by the saw-tooth shape of the dam region to be absorbed and attenuated.

10 Claims, 9 Drawing Sheets

(58) Field of Classification Search
CPC ......... H01L 27/14689; H01L 27/14618; H01L 27/14601; H01L 2224/732; H01L 2224/83951; H10F 39/804
See application file for complete search history.

(56) References Cited

FOREIGN PATENT DOCUMENTS

| | | | | |
|---|---|---|---|---|
| JP | 2008-187054 A | 8/2008 | | |
| JP | 2014-027069 A | 2/2014 | | |
| JP | 2016-163011 A | 9/2016 | | |
| JP | 2018-147974 A | 9/2018 | | |
| WO | 2016/039173 A1 | 3/2016 | | |
| WO | WO-2018159344 A1 * | 9/2018 | ......... | A61B 1/00006 |

* cited by examiner

SOLID-STATE IMAGING ELEMENT AND ELECTRONIC DEVICE

CROSS REFERENCE TO RELATED APPLICATIONS

This application is a U.S. National Phase of International Patent Application No. PCT/JP2020/044823 filed on Dec. 2, 2020, which claims priority benefit of Japanese Patent Application No. JP 2020-003397 filed in the Japan Patent Office on Jan. 14, 2020. Each of the above-referenced applications is hereby incorporated herein by reference in its entirety.

TECHNICAL FIELD

The present technology relates to a solid-state imaging element. Specifically, this relates to a solid-state imaging element provided with a chip mounting region in which a chip is mounted in addition to a pixel region, and an electronic device.

BACKGROUND ART

In a solid-state imaging element, in addition to a pixel region, a region in which a chip is mounted for adding a function may be provided on a substrate. For example, flip-chip mounting using a solder bump is known. In this case, in order to improve connection reliability thereof, for example, a resin excellent in fluidity referred to as an underfill resin fills a clearance between the substrate and the chip. Since this resin might flow out to the pixel region or a wire bond pad, a dam region is arranged around a flip-chip mounting area. For example, a solid-state imaging element provided with a slit that blocks an outflow of a resin in a dam region has been proposed (refer to, for example, Patent Document 1).

CITATION LIST

Patent Document

Patent Document 1: Japanese Patent Application Laid-Open No. 2018-147974

SUMMARY OF THE INVENTION

Problems to be Solved by the Invention

In the above-described conventional technology, since a long side direction of the dam region is flat, incident light might be reflected by a bottom surface or a side surface of the slit to be diffused, thereby generating flare in the pixel region to deteriorate an optical characteristic.

The present technology has been achieved in view of such a situation, and an object thereof is to suppress an influence of incident light in a dam region that blocks an outflow of a resin from a chip mounting region.

Solutions to Problems

The present technology has been achieved in order to solve the above-described problem, and a first aspect thereof is a solid-state imaging element provided with a pixel region in which a plurality of pixels is arranged, a chip mounting region in which a chip is mounted, and a dam region arranged around the chip mounting region and having a saw-tooth shape toward an outer side at least partially, and an electronic device. This brings an effect that reflection of incident light in the dam region is attenuated.

Furthermore, in the first aspect, in the saw-tooth shape in the dam region, an angle of a projection is desirably 90 degrees or smaller. This brings an effect that the reflection of the incident light by the saw-tooth shape is sufficiently attenuated.

Furthermore, in the first aspect, the pixel region may be provided with a first on-chip lens on an incident light side, the dam region may be provided with a second on-chip lens having a same shape as a shape of the first on-chip lens, and the saw-tooth shape in the dam region may be a structure obtained by connecting second on-chip lenses to each other. Therefore, a basic structure of a dam in the dam region has the saw-tooth shape.

Furthermore, in the first aspect, a size of the saw-tooth shape in the dam region may be an integral multiple of an arrangement pitch of the second on-chip lenses.

Furthermore, the first aspect may further be provided with an antireflection film formed on an upper surface of the second on-chip lens in the dam region. This brings an effect of preventing reflection of incident light.

Furthermore, in the first aspect, the saw-tooth shape in the dam region may be formed entirely on one side of the dam region or formed entirely on four sides of the dam region.

Furthermore, in the first aspect, the saw-tooth shape in the dam region may be a dam that blocks an outflow of a light-shielding resin that covers an upper surface and a side surface of the chip, or may be a dam that blocks an outflow of an underfill resin that fills a range in which the chip is flip-chip mounted in the chip mounting region.

MODE FOR CARRYING OUT THE INVENTION

A mode for carrying out the present technology (hereinafter, referred to as an embodiment) is hereinafter described. The description is given in the following order.

1. First Embodiment (example in which saw-tooth shape is provided partially in cylindrical shape of linear dam)
2. Second Embodiment (example in which basic structure of dam has saw-tooth shape)
3. Application Example (electronic device)

1. First Embodiment

[Planar Surface of Solid-State Imaging Element]

Figure 1:
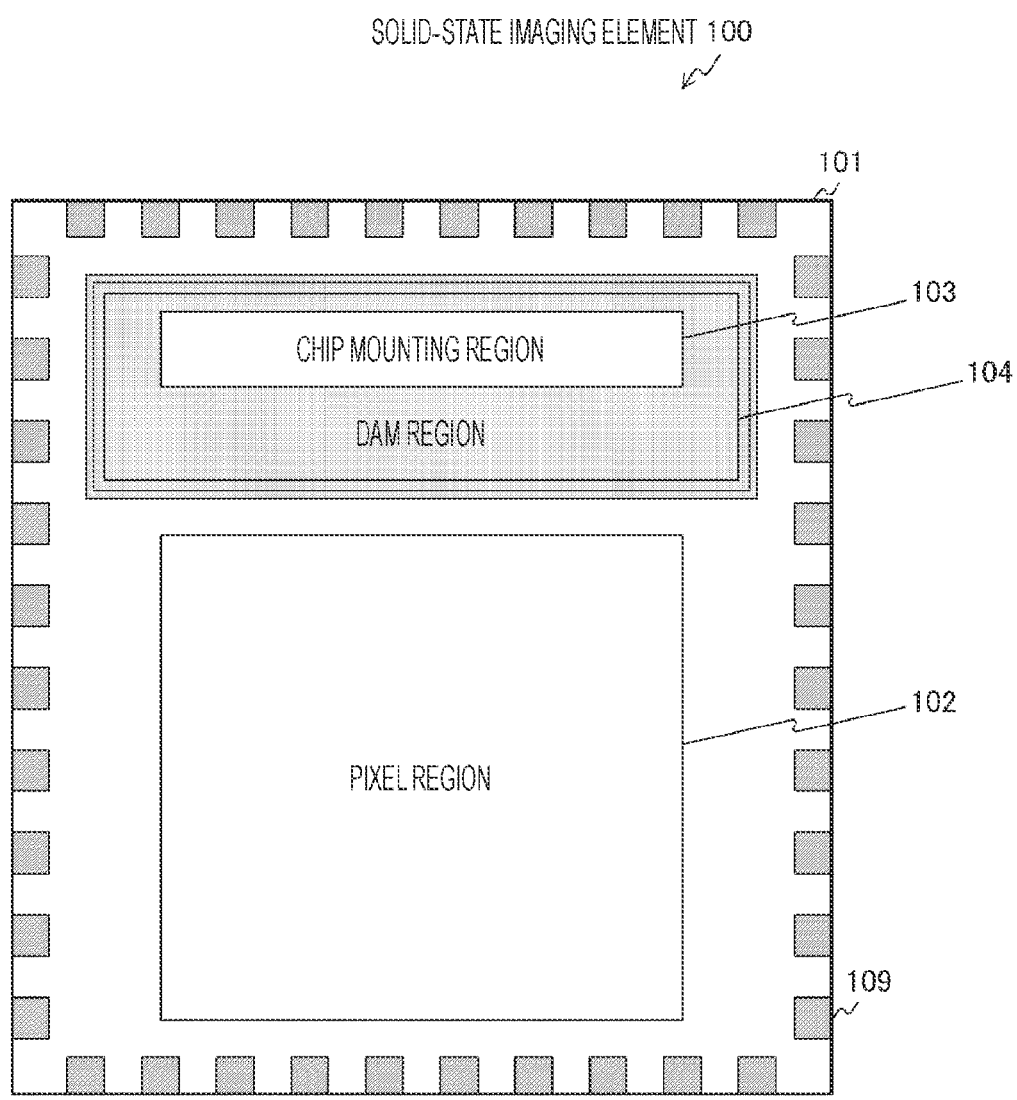
FIG. 1 is a planar view illustrating an example of a solid-state imaging element 100 in an embodiment of the present technology.

FIG. 1 is a planar view illustrating an example of a solid-state imaging element 100 in an embodiment of the present technology.

The solid-state imaging element 100 is provided with a pixel region 102, a chip mounting region 103, and a dam region 104 on a semiconductor substrate 101. The semiconductor substrate 101 includes as a main material, for example, silicon (Si) as a semiconductor.

The pixel region 102 is a region in which a plurality of pixels having a photoelectric conversion unit that generates and accumulates photocharges according to an amount of received light is two-dimensionally arranged in a matrix in a row direction and in a column direction.

The chip mounting region 103 is a region for flip-chip mounting a chip on which a circuit that performs predetermined signal processing is formed, for example.

The dam region 104 is a region arranged around the chip mounting region 103. The dam region 104 is provided with a dam for blocking an outflow of a resin from the chip mounting region 103.

A plurality of electrode pads 109 is formed on an outer peripheral portion of the solid-state imaging element 100. The electrode pad 109 is used as a contact of a probe in an inspection process and wire bonding.

[Cross Section of Solid-State Imaging Element]

Figure 2:
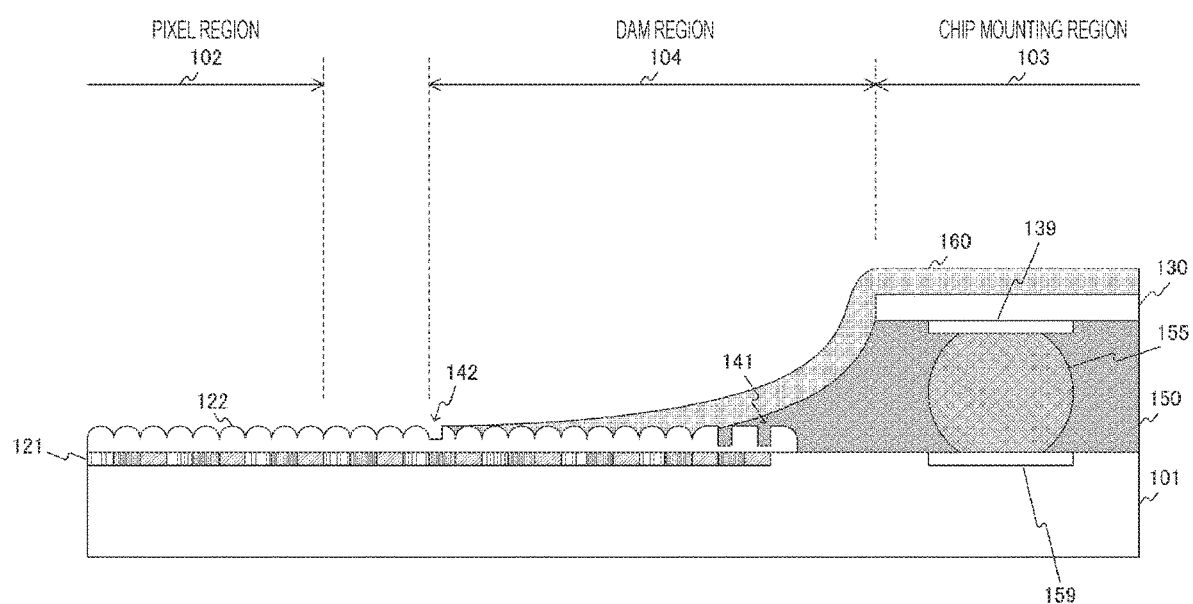
FIG. 2 is a cross-sectional view illustrating an example of the solid-state imaging element 100 in a first embodiment of the present technology.

FIG. 2 is a cross-sectional view illustrating an example of the solid-state imaging element 100 in a first embodiment of the present technology. The drawing illustrates a portion including ends of the pixel region 102 and the chip mounting region 103 and the dam region 104 therebetween.

In the pixel region 102, a photodiode as the photoelectric conversion unit is formed for every pixel in the semiconductor substrate 101, and an on-chip lens (OCL) 122 is formed for every pixel on the semiconductor substrate 101. On an upper surface of the OCL 122, for example, an antireflection film (low reflection film) using a low temperature oxide (LTO) film is formed. Furthermore, a color filter layer 121 that allows light of a predetermined wavelength of red (R), green (G), blue (B) and the like to pass is formed between the OCL 122 and the semiconductor substrate 101.

The OCL 122 includes, for example, silicon nitride (SiN) or a resin material such as a styrene resin, an acrylic resin, a styrene acrylic copolymer resin, or a siloxane resin. Furthermore, as materials of the antireflection film, silicon nitride (SiN), hafnium oxide (HfO2), aluminum oxide (Al2O3), zirconium oxide (ZrO2), tantalum oxide (Ta2O5), titanium oxide (TiO2), lanthanum oxide (LA2O3), praseodymium oxide (Pr2O3), cerium oxide (CeO2), neodymium oxide (Nd2O3), promethium oxide (Pm2O3), samarium oxide (Sm2O3), europium oxide (Eu2O3), gadolinium oxide (Gd2O3), terbium oxide (Tb2O3), dysprosium oxide (Dy2O3), holmium oxide (Ho2O3), thulium oxide (Tm2O3), ytterbium oxide (Yb2O3), lutetium oxide (Lu2O3), yttrium oxide (Y2O3) and the like may be used.

In the chip mounting region 103, a chip 130 is flip-chip mounted on the semiconductor substrate 101. Specifically, an electrode unit 139 of the chip 130 and an electrode unit 159 of the semiconductor substrate 101 are electrically connected to each other via a solder bump 155.

A clearance other than the solder bump 155 between the chip 130 and the semiconductor substrate 101 is filled with an underfill resin 150 in order to fill a gap. The underfill resin 150 includes, for example, an ultraviolet (UV) curable resin, a thermosetting resin and the like, and is formed by being injected into the clearance between the chip 130 and the semiconductor substrate 101 and then cured.

An upper surface and a side surface of the chip 130 and the underfill resin 150 around the chip 130 are covered with a light-shielding resin 160 including a black resin and the like having a light-shielding property in order to prevent reflection. The light-shielding resin 160 also includes an ultraviolet (UV) curable resin, a thermosetting resin and the like as is the case with the underfill resin 150, and is formed by being applied using a dispenser and then cured.

In contrast, in the dam region 104, the color filter layer 121 and the OCL 122 formed in the pixel region 102 are directly extended to be formed. In this example, the pixel region 102 and the dam region 104 are separated from each other by a distance corresponding to four pixels, and the OCL 122 and the color filter layer 121 are also formed in a region between the pixel region 102 and the dam region 104. The region between the pixel region 102 and the dam region 104 may be omitted, or may be considered as a part of the dam region 104.

Furthermore, a slit 141 for blocking the underfill resin 150 may be formed as a dam in the dam region 104. Since the slit 141 is covered with the light-shielding resin 160, this does not affect reflection of incident light.

A dam 142 for blocking the light-shielding resin 160 is formed in an outer peripheral portion of the dam region 104. Note that, the dam 142 may have a function of blocking the underfill resin 150. A shape of the dam 142 is described below.

[Shape of Dam]

Figure 3:
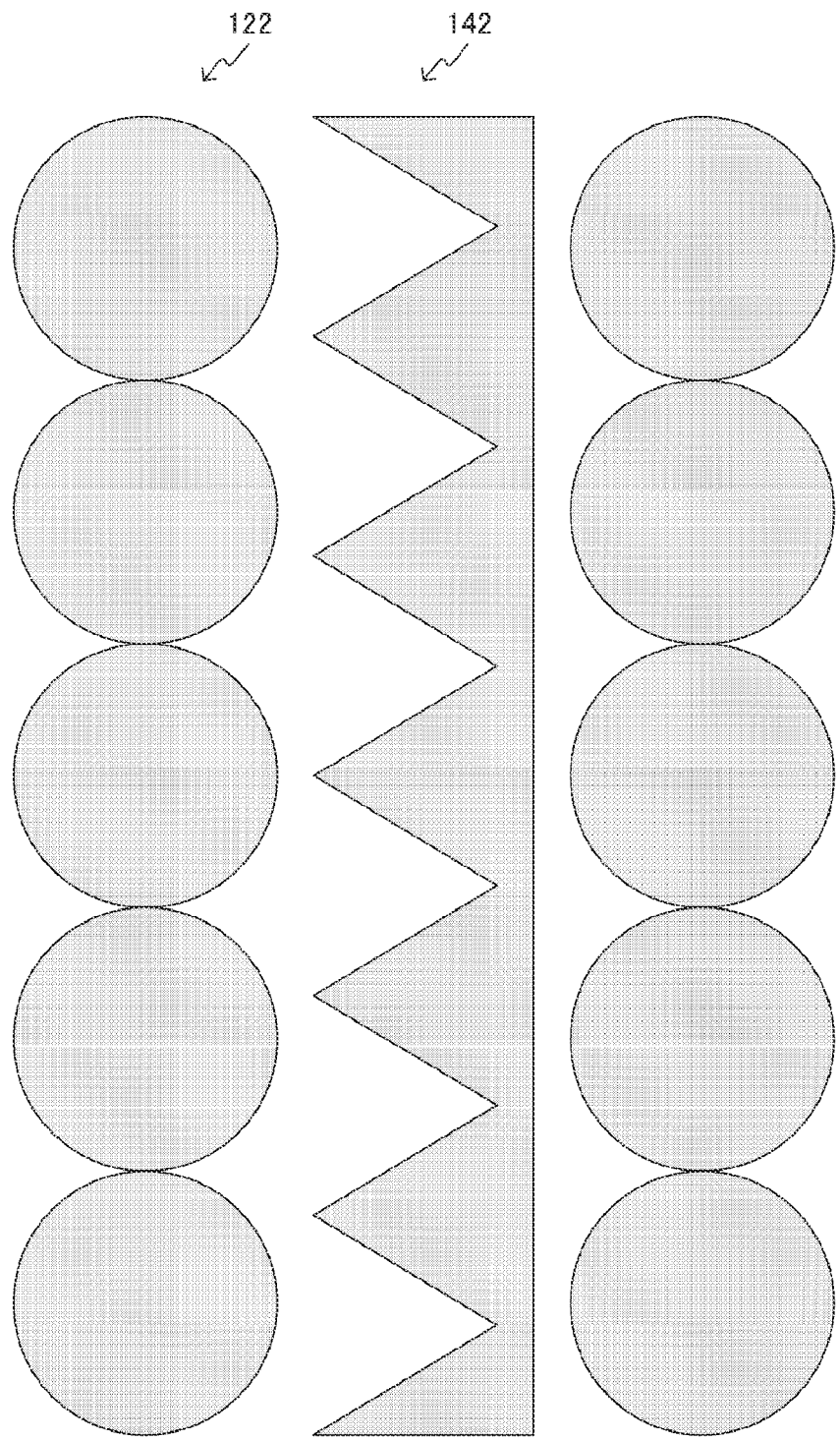
FIG. 3 is a planar view illustrating an example of a shape of a dam 142 in the first embodiment of the present technology.
Figure 4:
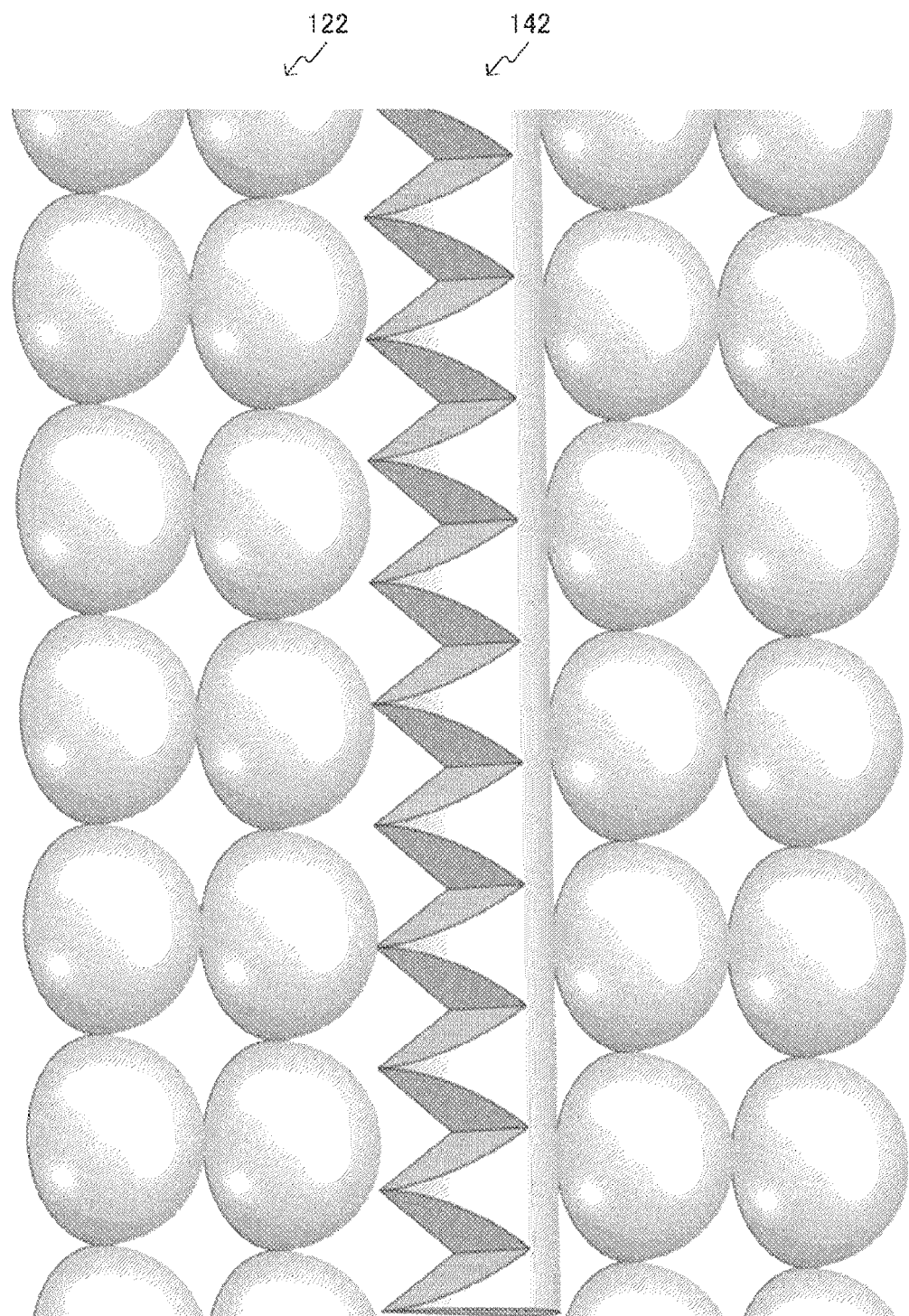
FIG. 4 is a perspective view illustrating an example of the shape of the dam 142 in the first embodiment of the present technology.

FIG. 3 is a planar view illustrating an example of the shape of the dam 142 in the first embodiment of the present technology. Furthermore, FIG. 4 is a perspective view illustrating an example of the shape of the dam 142 in the first embodiment of the present technology.

The dam 142 has a saw-tooth shape toward an outer side of the dam region 104 in a semi-cylindrical shape obtained by linearly connecting the OCLs 122. This saw-tooth shape is provided at least partially in the dam region 104. For example, this may be provided partially or entirely on one side facing the pixel region 102. Furthermore, this may also be provided entirely on four sides.

In the saw-tooth shape (jagged shape) of the dam 142, an angle of a projection is desirably 90 degrees or smaller. Therefore, the incident light is repeatedly reflected at an opening sandwiched between the projections to be attenuated. Therefore, occurrence of flare may be prevented.

Furthermore, since the dam 142 has the shape obtained by linearly connecting the OCLs 122, a size of the dam 142 is an integral multiple of an arrangement pitch of the OCLs 122.

[Forming Method of Dam]

Figure 5:
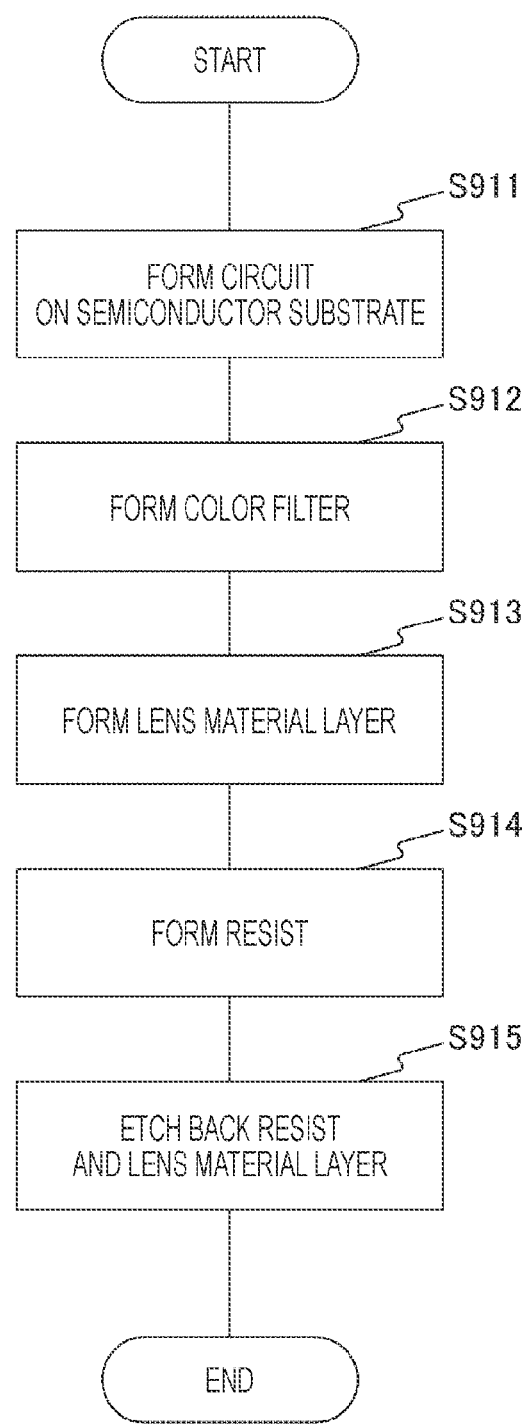
FIG. 5 is a flow chart illustrating an example of a forming method of the dam 142 in the first embodiment of the present technology.

FIG. 5 is a flow chart illustrating an example of a forming method of the dam 142 in the first embodiment of the present technology.

A circuit such as a light reception unit and a transfer channel region is formed on the semiconductor substrate 101, and a transfer electrode, a light-shielding film and the like are formed (step S911). Moreover, after an interlayer insulating film is formed on an entire surface, a planarization film is formed, and the color filter layer 121 is formed thereon (step S912).

A lens material layer that becomes the OCL 122 or the dam 142 is formed on the color filter layer 121 (step S913). The lens material layer is formed by, for example, applying a resin by spin coating and the like and curing the same.

Next, a resist is formed on the lens material layer using a pattern of the OCL 122 and the dam 142 (step S914). Then, after the resist is patterned into the shape of the OCL 122 or the dam 142 by a photolithography process, for example, the resist is softened by heating and processed into the shape of the OCL 122 or the dam 142.

Then, the resist and the lens material layer in the shape of the OCL 122 or the dam 142 are etched back (step S915). In this etching, for example, anisotropic reactive ion etching (RIE) using CF4/O2 as an etching gas may be used.

Therefore, a hemispherical shape of the resist is transferred to the lens material layer, and the shape of the OCL 122 and the dam 142 is formed.

In this manner, according to the first embodiment of the present technology, by providing the dam 142 having the saw-tooth shape toward the outer side of the dam region 104, it is possible to attenuate reflection of the incident light and prevent the occurrence of the flare. Then, an optical characteristic in the pixel region 102 may be improved with this arrangement.

2. Second Embodiment

In the first embodiment described above, the saw-tooth shape is provided partially in the linear cylindrical shape, but a basic structure of the dam is not necessarily linear. In this second embodiment, an example in which a basic structure of the dam has a saw-tooth shape is described. Note that, an entire configuration as a solid-state imaging element 100 is similar to that of the above-described first embodiment, so that the detailed description thereof is omitted.

[Cross Section of Solid-State Imaging Element]

Figure 6:
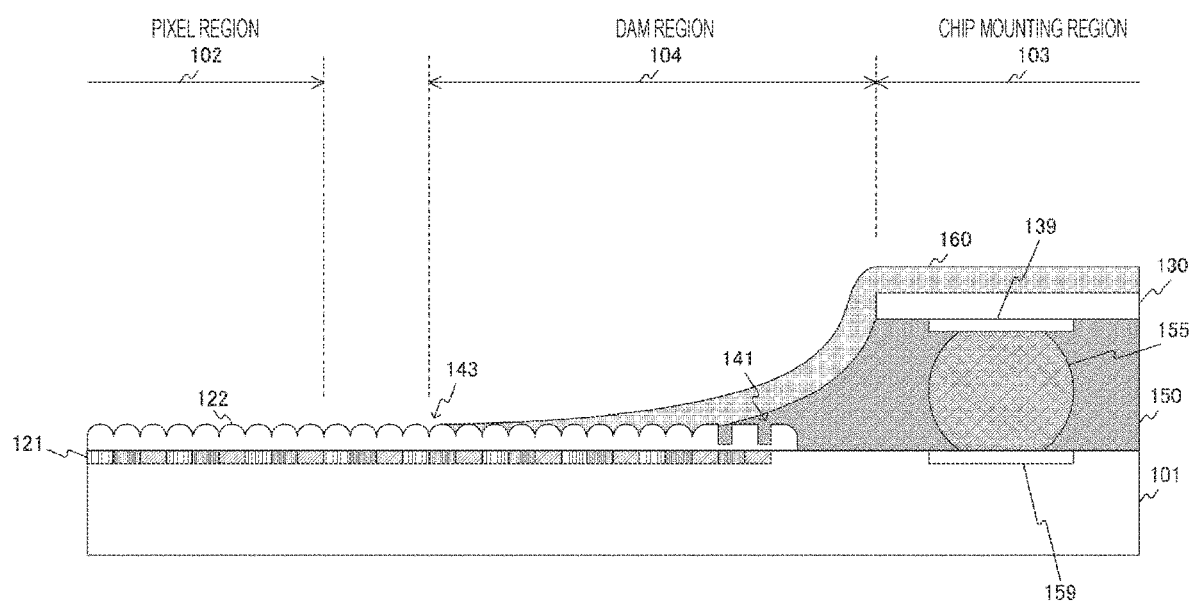
FIG. 6 is a cross-sectional view illustrating an example of a solid-state imaging element 100 in a second embodiment of the present technology.

FIG. 6 is a cross-sectional view illustrating an example of the solid-state imaging element 100 in the second embodiment of the present technology.

The solid-state imaging element 100 according to the second embodiment is basically provided with a cross-sectional structure similar to that of the first embodiment described above. Note that, a structure of a dam 143 for blocking a light-shielding resin 160 formed in an outer peripheral portion of a dam region 104 is different. A shape of the dam 143 is described below.

[Shape of Dam]

Figure 7:
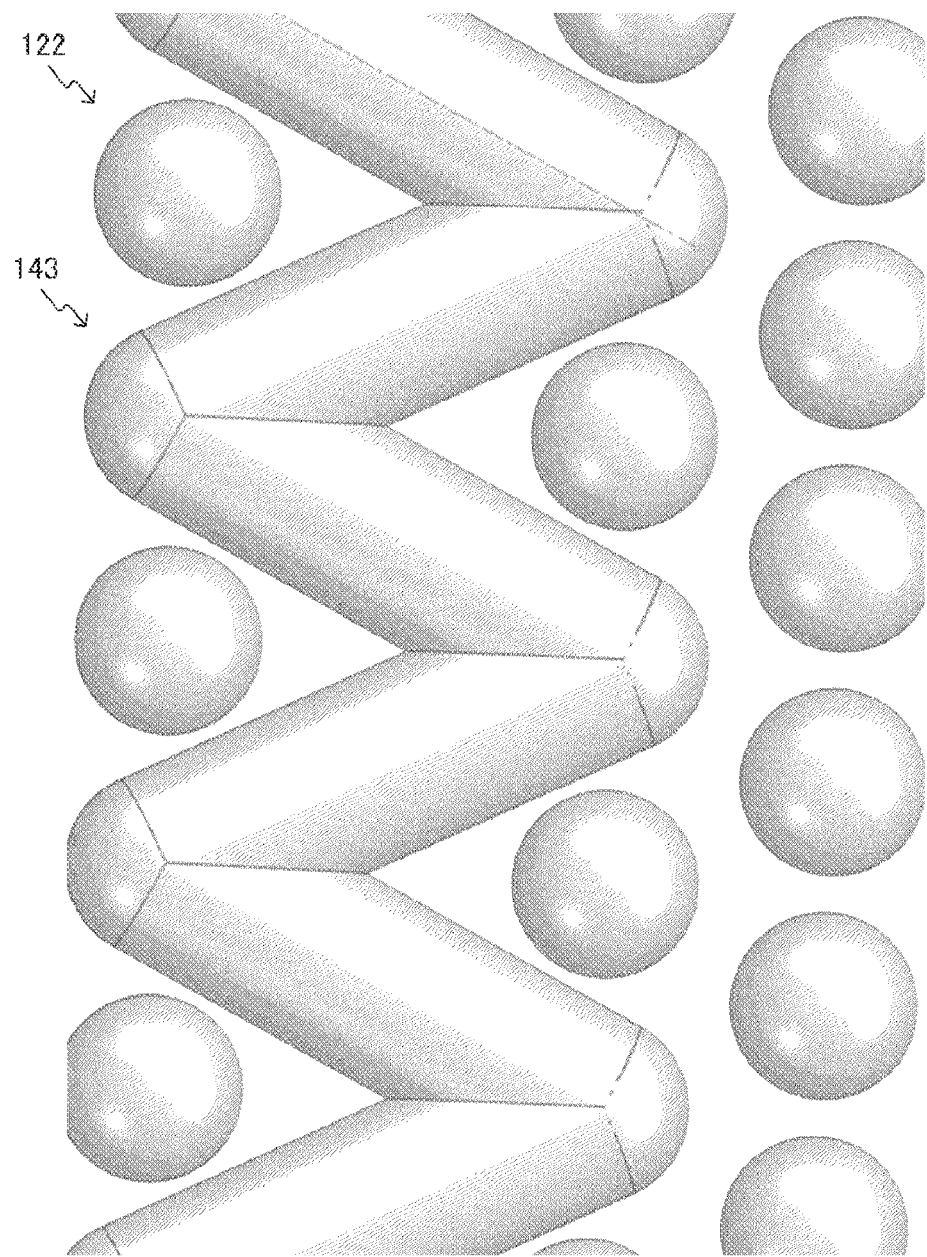
FIG. 7 is a planar view illustrating an example of a shape of a dam 143 in the second embodiment of the present technology.
Figure 8:
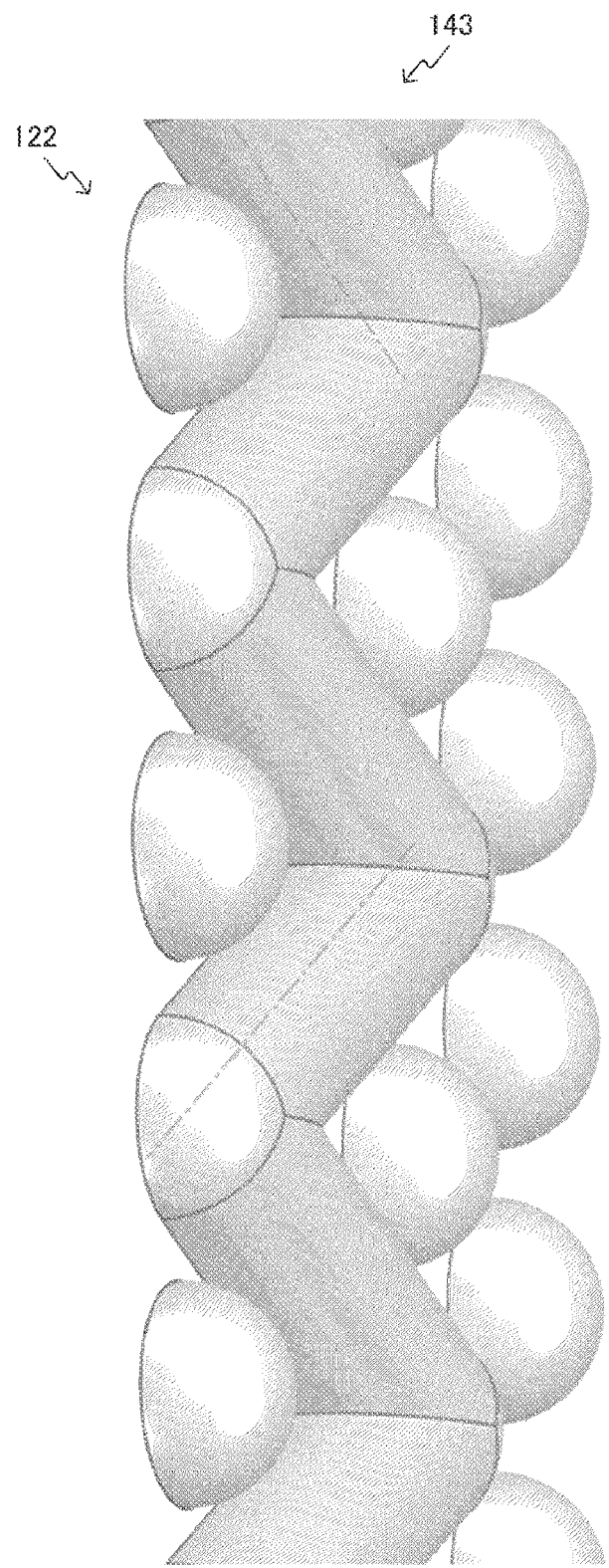
FIG. 8 is a perspective view illustrating an example of the shape of the dam 143 in the second embodiment of the present technology.

FIG. 7 is a planar view illustrating an example of the shape of the dam 143 in the second embodiment of the present technology. Furthermore, FIG. 8 is a perspective view illustrating an example of the shape of the dam 143 in the second embodiment of the present technology.

The dam 143 has a shape obtained by connecting OCLs 122 in a zigzag manner, and has a saw-tooth shape toward an outer side and an inner side of the dam region 104. The dam 143 in the saw-tooth shape is provided at least partially in the dam region 104, and may have a linear semi-cylindrical shape in other parts. For example, this may be provided partially or entirely on one side facing the pixel region 102. Furthermore, this may also be provided entirely on four sides. Furthermore, the dam 142 of the first embodiment described above may be formed in the linear portion.

In the saw-tooth shape (jagged shape) of the dam 143, an angle of a projection is desirably 90 degrees or smaller.

Therefore, the incident light is repeatedly reflected at an opening sandwiched between the projections to be attenuated. Therefore, occurrence of flare may be prevented.

Furthermore, since the dam 143 has the shape obtained by connecting the OCLs 122 in a zigzag manner, a size of the saw-tooth shape of the dam 143 is an integral multiple of an arrangement pitch of the OCLs 122.

Note that, the dam 143 in the second embodiment is also formed in a manner similar to that in the first embodiment described above.

In this manner, according to the second embodiment of the present technology, by providing the dam 143 having the saw-tooth shape toward the outer side of the dam region 104, it is possible to attenuate reflection of the incident light and prevent the occurrence of the flare. Then, an optical characteristic in the pixel region 102 may be improved with this arrangement.

Note that, in the first and second embodiments described above, an example in which one dam is arranged is described, but a plurality of dams may be arranged.

3. Application Example

[Electronic Device]

Figure 9:
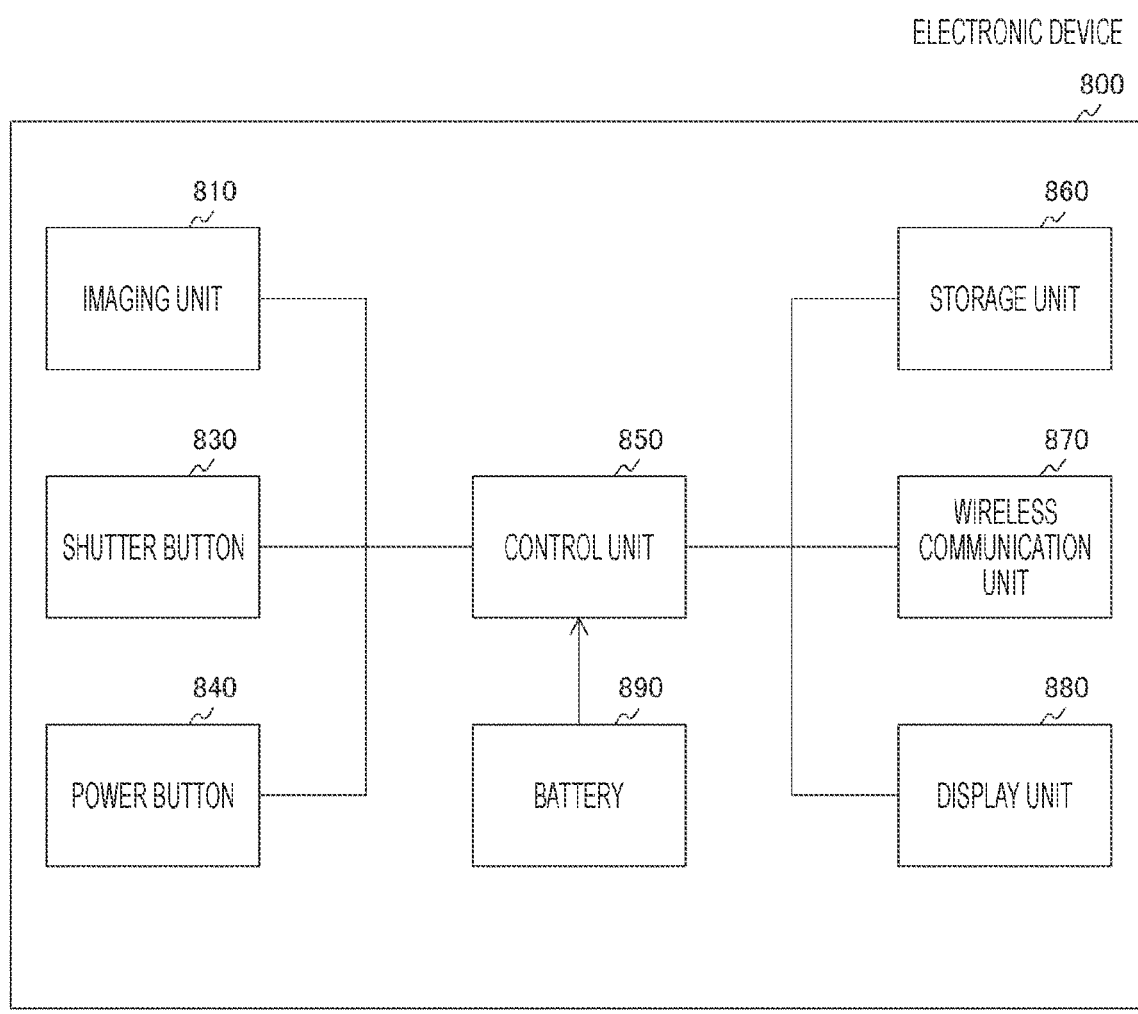
FIG. 9 is a view illustrating a system configuration example of an electronic device 800 to which the embodiment of the present technology is applied.

FIG. 9 is a view illustrating a system configuration example of an electronic device 800 to which the embodiment of the present technology is applied.

The electronic device 800 is a mobile terminal having a function as an imaging device. This electronic device 800 is provided with an imaging unit 810, a shutter button 830, a power button 840, a control unit 850, a storage unit 860, a wireless communication unit 870, a display unit 880, and a battery 890.

The imaging unit 810 is an image sensor that images a subject. The imaging unit 810 is provided with the above-described solid-state imaging element 100.

The shutter button 830 is a button for indicating an imaging timing by the imaging unit 810 from an outer side of the electronic device 800. The power button 840 is a button for indicating turning on/off of the power of the electronic device 800 from the outer side of the electronic device 800.

The control unit 850 is a processing unit that controls an entire electronic device 800. The storage unit 860 is a memory that stores data and a program required for operation of the electronic device 800. The wireless communication unit 870 performs wireless communication with the outer side of the electronic device 800. The display unit 880 is a display that displays an image and the like. The battery 890 is a power supply source that supplies power to each unit of the electronic device 800.

Note that, the above-described embodiment describes an example of embodying the present technology, and there is a correspondence relationship between items in the embodiment and the matters specifying the invention in claims. Similarly, there is a correspondence relationship between the matters specifying the invention in claims and the matters in the embodiment of the present technology having the same names. However, the present technology is not limited to the embodiment and may be embodied by variously modifying the embodiment without departing from the gist thereof.

Note that, the effect described in this specification is illustrative only and is not limitative; there may also be another effect.

Note that, the present technology may also have a following configuration.

(1) A solid-state imaging element provided with:

a pixel region in which a plurality of pixels is arranged;
a chip mounting region in which a chip is mounted; and
a dam region arranged around the chip mounting region and having a saw-tooth shape toward an outer side at least partially.

(2) The solid-state imaging element according to (1) described above, in which
in the saw-tooth shape in the dam region, an angle of a projection is 90 degrees or smaller.

(3) The solid-state imaging element according to (1) or (2) described above, in which
the pixel region is provided with a first on-chip lens on an incident light side,
the dam region is provided with a second on-chip lens having a same shape as a shape of the first on-chip lens, and
the saw-tooth shape in the dam region is a structure obtained by connecting second on-chip lenses to each other.

(4) The solid-state imaging element according to (3) described above, in which
a size of the saw-tooth shape in the dam region is an integral multiple of an arrangement pitch of the second on-chip lenses.

(5) The solid-state imaging element according (3) or (4) described above, further provided with:
an antireflection film formed on an upper surface of the second on-chip lens in the dam region.

(6) The solid-state imaging element according to any one of (1) to (5) described above, in which
the saw-tooth shape in the dam region is formed entirely on one side of the dam region.

(7) The solid-state imaging element according to any one of (1) to (5) described above, in which
the saw-tooth shape in the dam region is formed entirely on four sides of the dam region.

(8) The solid-state imaging element according to any one of (1) to (7) described above, in which
the saw-tooth shape in the dam region is a dam that blocks an outflow of a light-shielding resin that covers an upper surface and a side surface of the chip.

(9) The solid-state imaging element according to any one of (1) to (7) described above, in which
the saw-tooth shape in the dam region is a dam that blocks an outflow of an underfill resin that fills a range in which the chip is flip-chip mounted in the chip mounting region.

(10) An electronic device provided with:
a solid-state imaging element provided with: a pixel region in which a plurality of pixels is arranged; a chip mounting region in which a chip is mounted; and a dam region arranged around the chip mounting region and having a saw-tooth shape toward an outer side at least partially.

REFERENCE SIGNS LIST

100 Solid-state imaging element
101 Semiconductor substrate
102 Pixel region
103 Chip mounting region
104 Dam region
109 Electrode pad
121 Color filter layer
122 On-chip lens (OCL)
130 Chip
139 Electrode unit
141 Slit
142, 143 Dam
150 Underfill resin
155 Solder bump
159 Electrode unit
160 Light-shielding resin
800 Electronic device
810 Imaging unit

The invention claimed is:
1. A solid-state imaging element, comprising:
a pixel region including a plurality of pixels;
a chip mounting region;
a chip on the chip mounting region; and
a dam region around the chip mounting region, wherein
the dam region includes a plurality of first on-chip lenses connected in a zigzag manner,
the dam region has a saw-tooth shape,
the saw-tooth shape of the dam region is based on the connection of the plurality of first on-chip lenses in the zigzag manner, and
the saw-tooth shape is toward an outer side of the dam region.

2. The solid-state imaging element according to claim 1, wherein
in the saw-tooth shape of the dam region, an angle of a projection is one of less than or equal to 90 degrees.

3. The solid-state imaging element according to claim 1, wherein
the pixel region further includes a second on-chip lens on an incident light side of the solid-state imaging element, and
a shape of the second on-chip lens is same as a shape of at least one first on-chip lens of the plurality of first on-chip lenses.

4. The solid-state imaging element according to claim 3, wherein a size of the saw-tooth shape in the dam region is an integral multiple of an arrangement pitch of the plurality of first on-chip lenses.

5. The solid-state imaging element according to claim 3, further comprising
an antireflection film on an upper surface of each of the plurality of first on-chip lenses.

6. The solid-state imaging element according to claim 1, wherein the saw-tooth shape in the dam region is entirely on one side of the dam region.

7. The solid-state imaging element according to claim 1, wherein the saw-tooth shape in the dam region is entirely on four sides of the dam region.

8. The solid-state imaging element according to claim 1, further comprising a light-shielding resin, wherein
the light-shielding resin covers each of an upper surface of the chip and a side surface of the chip,
the saw-tooth shape in the dam region corresponds to a dam, and
the dam is configured to block an outflow of the light-shielding resin.

9. The solid-state imaging element according to claim 1, further comprising:
an underfill resin; and
a semiconductor substrate, wherein
the underfill resin fills a gap in the chip mounting region,
the gap is between the chip and the semiconductor substrate,
the chip is flip-chip on the semiconductor substrate,
the saw-tooth shape in the dam region corresponds to a dam, and the dam is configured to block an outflow of the underfill resin.

10. An electronic device, comprising:
a solid-state imaging element that includes:
  a pixel region including a plurality of pixels;
  a chip mounting region;
  a chip on the chip mounting region; and
  a dam region around the chip mounting region, wherein
    the dam region includes a plurality of on-chip lenses connected in a zigzag manner,
    the dam region has a saw-tooth shape,
    the saw-tooth shape of the dam region is based on the connection of the plurality of on-chip lenses in the zigzag manner, and
    the saw-tooth shape is toward an outer side of the dam region.

\* \* \* \* \*